United States Patent
Levy

(10) Patent No.: US 8,487,234 B2
(45) Date of Patent: *Jul. 16, 2013

(54) ELECTRON EMISSION DEVICE HAVING AN ELECTRODES' ARRANGEMENT AND AN ANTENNA CIRCUIT WITH OPERATIONAL FREQUENCY IN THZ-RANGE

(75) Inventor: Jeffrey Levy, Tel Aviv (IL)

(73) Assignee: Novatrans Group SA, Vaumarcus NE (CH)

( * ) Notice: Subject to any disclaimer, the term of this patent is extended or adjusted under 35 U.S.C. 154(b) by 0 days.

This patent is subject to a terminal disclaimer.

(21) Appl. No.: 13/425,673

(22) Filed: Mar. 21, 2012

(65) Prior Publication Data

US 2012/0181429 A1    Jul. 19, 2012

Related U.S. Application Data

(63) Continuation of application No. 12/300,192, filed as application No. PCT/IL2007/000582 on May 13, 2007, now Pat. No. 8,143,566.

(60) Provisional application No. 60/799,353, filed on May 11, 2006.

(51) Int. Cl.
    *H01J 40/14* (2006.01)
(52) U.S. Cl.
    USPC .................................. 250/214 R; 250/214.1
(58) Field of Classification Search
    USPC ................... 250/214 R, 214.1, 338.1–338.4, 250/339.01–339.06, 239; 315/149, 150; 313/542, 576
    See application file for complete search history.

(56) References Cited

U.S. PATENT DOCUMENTS

| 4,464,572 A | 8/1984 | Hirschfeld |
| 4,703,228 A | 10/1987 | West |
| 5,894,125 A * | 4/1999 | Brener et al. ................. 250/330 |
| 7,646,149 B2 | 1/2010 | Naaman et al. |
| 2005/0018467 A1 | 1/2005 | Naaman et al. |

FOREIGN PATENT DOCUMENTS

| WO | WO 2005/008711 A2 | 1/2005 |
| WO | WO 2006/077595 A2 | 7/2006 |

OTHER PUBLICATIONS

McIntosh et al.; "Terahertz photomixing with diode lasers in low-temperature-grown GaAs;" *Appl. Phys. Lett.*; Dec. 1995; pp. 3844-3846; vol. 67, No. 26.
Brown et al.; "Photomixing up to 3.8 THz in low-temperature-grown GaAs;" *Appl. Phys. Lett.*; Jan. 1995; pp. 285-287; vol. 66, No. 3.
Apr. 20, 2011 Office Action issued in U.S. Appl. No. 12/300,192.
Nov. 18, 2011 Notice of Allowance issued in U.S. Appl. No. 12/300,192.

* cited by examiner

*Primary Examiner* — Que T Le
(74) *Attorney, Agent, or Firm* — Oliff & Berridge, PLC

(57) ABSTRACT

An electric device operable with a THz-range frequency of the device output is presented. The device comprises a photocathode installed in either one of a diode, triode and tetrode configuration, and is exposed to illumination. In some embodiments of the invention, the device is configured as a diode and photomixing is used for illumination of the photocathode with light in the THz range, the diode converting this input light signal into an electrical output in the THz range, which operates a signal transmitter/receiver. In some other embodiments of the invention, the device is configured as a triode or tetrode, where the electrodes have small dimensions (about 1 micron or less) and are spaced from one another a distance not exceeding 1 micron. The photocathode is kept under certain illumination, and electrical signal applied to one of the electrodes results in the THz output at one of the other electrodes.

24 Claims, 4 Drawing Sheets

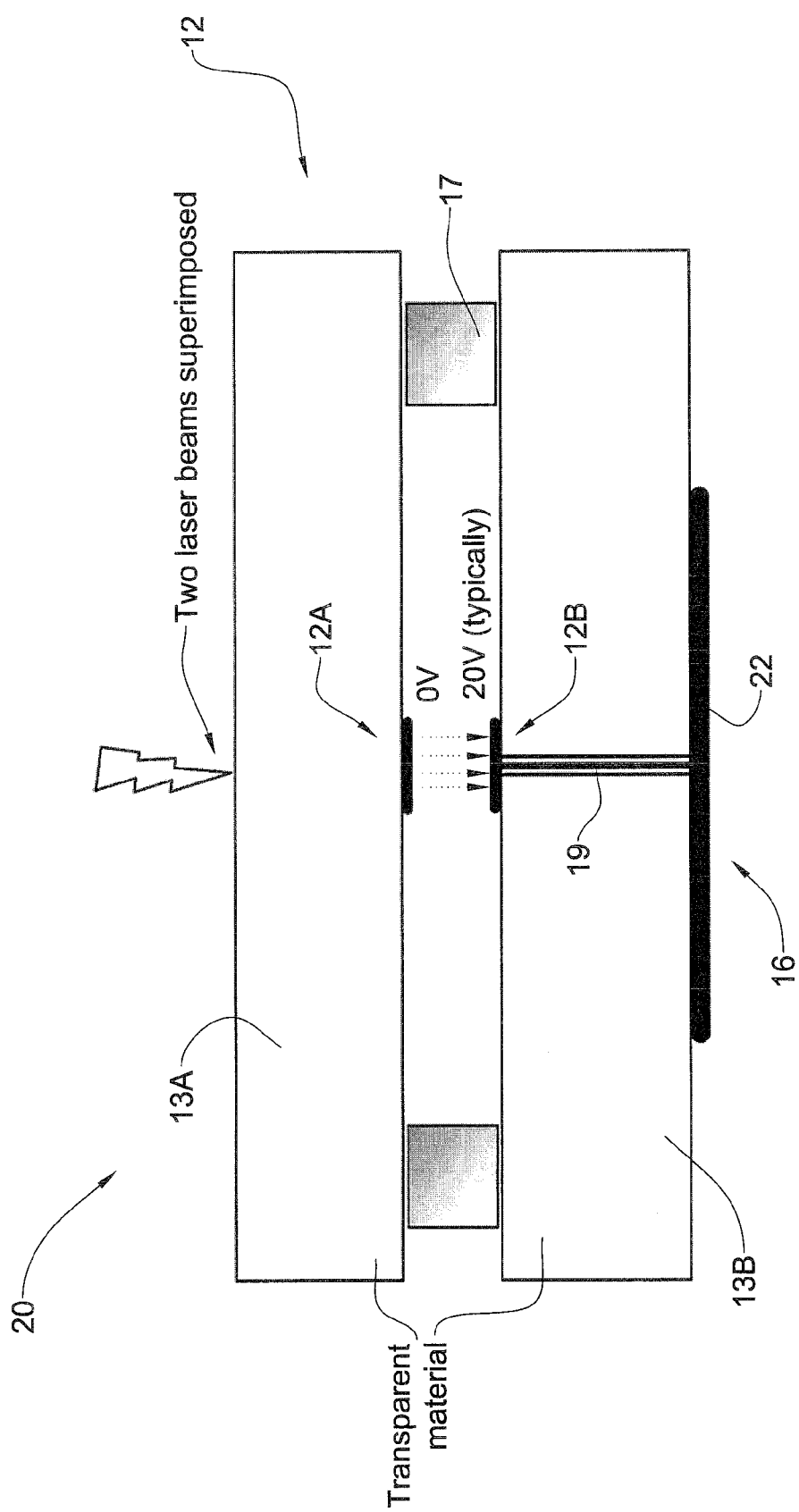

ELECTRON EMISSION DEVICE HAVING AN ELECTRODES' ARRANGEMENT AND AN ANTENNA CIRCUIT WITH OPERATIONAL FREQUENCY IN THZ-RANGE

This is a Continuation of application Ser. No. 12/300,192 filed Nov. 10, 2008, which in turn is a U.S. National Phase of International Patent Application No. PCT/IL2007/000582 filed May 13, 2007, which claims the benefit of U.S. Provisional Application No. 60/799,353 filed May 11, 2006. The disclosures of the prior applications are hereby incorporated by reference herein in their entirety.

FIELD OF THE INVENTION

This invention relates to an electric photoemission device capable of operating at high (e.g. Terahertz) frequencies and with high photocurrent density.

BACKGROUND OF THE INVENTION

Applications requiring electric devices operable at Terahertz (THz) frequencies are desirable in many areas such as medical imaging, security detection of hostile objects and noxious chemicals, and others. The THz regime, commonly defined as the range from 300 GHz to 10 THz, corresponds to wavelengths between 1 mm and 30 μm. THz radiation is able to penetrate a variety of materials which are opaque to visible light, such as clothing or paper. On the other hand, THz radiation is absorbed by water and organic substances, materials commonly perceived as transparent. These unique absorption properties lend themselves for various screening and imaging techniques.

A current approach for operating at THz frequencies is based on the use of CMOS technology, more specifically the use of GaAs semiconductor antenna. However, for efficient THz generation in such antenna, employing GaAs photomixer, the laser wavelength has to be smaller than the semiconductor bandgap and the laser sources must be powerful, and as many THz absorption lines are tens or hundreds of GHz broad, must have a large mode-hop-free tuning range. The use of GaAs semiconductor antenna is problematic due to the limit on the speed of electrons in a semiconductor. Therefore the THz range is a spectral gap, in which effective operation of electronics based complex systems are hard to implement.

GENERAL DESCRIPTION OF THE INVENTION

There is a need in the art in an electric device capable of operating with both high photocurrent density and high frequencies.

The inventors have found that appropriate arrangement of a photoemission based electric device, in which electrons travel in a free space (vacuum), provides for obtaining desirably higher operational frequencies and emission current densities.

The limitation on current density appears to be a result mainly of photocathode degradation and of space charge. The causes of photocathode fatigue and instability are usually divided into two categories: those which are relevant or dominant in the absence of current flow, and those which are relevant or dominant in the presence of current flow.

Three principal factors fall in the first category: oxidation of the photocathode by residual gases, excess or shortage of Cs coating, and overheating. These effects are essentially consequences of various failures during the photocathode production and/or storage process. Oxidation, for example, depends on the presence of residual gases, which is a result of either insufficient pumping/degassing of the substrate and other envelope parts or due to the formation of leaks along the vacuum seal. Excess or shortage of Cs is typically a result of low activation temperature or insufficient activation time, respectively. Overheating of the photocathode (maximal temperature is typically in the range 100° C.-200° C.) can occur during storage or by strong absorbed light. Such effects can be avoided by taking necessary precautions and using optimal production and storage processes.

The main causes for photocathode deterioration in the presence of current flow are of a more fundamental nature.

One such cause is known as ion bombardment. The gas pressure within conventional phototubes is usually in the range of $10^{-6}$ to $10^{-8}$ torr. This pressure is high enough to allow for occasional collisions between emitted, accelerated photoelectrons and gas molecules, resulting in the production of positive ions. These ions are accelerated by the electric field in the phototube and cause damage to the photocathode when they strike its surface. Ion bombardment is the most significant fatigue mechanism in conventional phototubes, photomultipliers, etc.

The high resistance of semitransparent photocathodes also contributes to their deterioration. The sheet resistance of semitransparent photocathodes is very high, reaching $10^6$-$10^7$ Ω/sq depending on the type of photocathode. As a result, when current is emitted from a semitransparent photocathode, a relatively large potential difference appears between the photocathode's inner area and the conductive ring that serves as an electrical contact to the photocathode. This potential difference can, in turn, lead to the following mechanisms of performance deterioration. First, the inner areas of the photocathode become positively charged. Consequentially, only the most energetic electrons (if any) are able to overcome the resultant positive potential and be emitted. This effect prevents high emission current, but does not cause irreversible damage to the photocathode structure. Second, a sufficiently large potential difference between the inner photocathode areas and the electric contact can cause electrolytic decomposition of Cs—Sb (or K—Sb, etc.) compound. This irreversible effect is easily recognizable by a change of the photocathode's color. Third, the flow of sufficiently high current through an electrically resistive medium can lead to dissipation of large amounts of heat, and consequentially, to overheating of the photocathode material.

The highest values of the photocurrent density under which transparent alkali-based photocathodes remain stable are usually quoted in professional literature as 1-10 μA/cm², apart from S-20 photocathodes which were observed to remain stable at current densities of several mA/cm². The currents obtained from reflective mode photocathodes are not limited by the high in-plane photocathode resistance and should be considerably higher. For example, an experiment carried out by the inventors proved the stability of CsSb reflective-mode photocathode at about 1 mA/cm² and 25V for at least half a year.

In the case of the pulsed photocathode currents, the peak current values may be much higher than for continuous wave operation. The average currents (calculated while taking into account the duty cycle of the pulses) are still limited by the photocathode resistance issues. For example, pulse currents (pulse length of 1-10 μs) of more than 1 A (from a couple of cm²) were extracted from the commercially available phototubes Φ-13 and Φ-22 with S-20 reflective-mode photocathode [A. G. Berkovsky, V. A. Gavanin, and I. N. Zajdel, *Vacuum Photoelectronic Devices, Moscow* (1976)].

A current density of 1 A/cm² is close to the space charge limit for the phototubes of conventional dimensions. Indeed, according to the Child's law $$J = 2.33 \cdot 10^{-6} \cdot \frac{V^{\frac{3}{2}}}{d^2},$$

the limiting cathode-anode distance for obtaining J=1 A/cm² in the space charge regime can be expressed as $$d = 15 \cdot 10^{-6} \cdot V^{3/4}.$$

For an anode voltage of 100 V this distance is about 0.5 mm. If the cathode and anode are further apart, then the anode current would be limited by space charge effects and not by the photocathode performance. Therefore, it is practically impossible to reach higher current densities with the conventional tubes.

The technique developed by the inventors provides a solution to the problems mentioned above and allows for a high-frequency and high-density photocurrent device. Furthermore, the technique disclosed in the present application utilizes small device dimensions to overcome the limitation on charge carrier velocity and thus present a device operable at high (e.g. THz) frequencies.

The disclosed technique takes advantage of the earlier techniques developed by the inventor of the present application and disclosed in WO05008711 and WO06077595, according to which an electron emission device includes a photocathode and anode electrodes and possibly also a gate electrode, where the cathode is exposable to suitable illumination to induce emission of electrons therefrom.

In a device according to the present disclosure, the cathode and/or anode electrode areas, as well as the inter-electrode distances, are of micron to sub-micron dimensions, preferably on the order of tens to hundreds of nanometers. The emitted electrons traverse the inter-electrode cavities, and their trajectories are determined by the electrode potentials.

Free electrons can be induced to move very fast compared to lattice electrons (or holes) in a semiconductor material. By making the dimensions of the device small, the average "transit time", which is the time it takes an electron to complete its trajectory within the device, can be made very short, and fundamentally better than in CMOS devices. Also, the smaller the device's dimensions, the higher its maximal frequency of operation, as determined by the mutual conductance to capacitance ratio. The operation of such a device, however, crucially depends on the amount of emitted photocurrent density.

As mentioned above, one of the possible limitations on current density is the space charge limit; the limit on emission current density as a result of the repelling force of previously emitted electrons within the cavity. In a device according to the present disclosure, this limit is relatively high due to the very small inter-electrode distances. According to Child's Law, the maximal current (due to space charge) is inversely proportional to the cathode-anode distance squared. If this distance is made very small, then space charge limitation is significantly lessened.

Another advantage of a device according to the present disclosure is that it operates at relatively low voltages (i.e. potential differences between the electrodes), e.g. of the order of a few volts (as opposed to even thousands of volts used in some current applications). This is important also with regard to degradation of the cathode, and hence with regard to the emitted current density and the frequency of operation.

The problem of ion bombardment could be avoided in the device according to the present disclosure not only by the small cavity dimensions, which, along with suitable vacuum, imply a very small chance of collision, but also by a possibility of operating with small potential differences between the electrodes and hence low energy of the particles. The probability of collisions between emitted electrons and gas molecules is significantly reduced due to the short cathode-anode distance, which is shorter than the mean free path of the electrons (which is about 4 mm at a pressure of 1 torr), and to the very small volume of the device envelope, in which the number of residual gas molecules is extremely small. (In a volume of 3µ×3µ×0.5µ at a pressure of $10^{-5}$ torr the number of gas molecules is of the order of one). Moreover, if the cathode-anode potential difference is smaller than the ionization energy of the residual gases, then ionization by accelerated electrons cannot take place. The ion bombardment effect can be eliminated by keeping the anode-cathode voltage of a value not exceeding the ionization voltage (which is about a few tens of volts), e.g. using the anode-cathode voltage of about 15 Volts. It should be understood that the present device can operate with higher voltages (e.g. 100V) in order to provide higher operational power, but in this case the photocathode life time may be shorter.

Another electrode damaging process is the heating of the material as a result of current flow due to an internal voltage drop. Furthermore, because the electrode area is small, heat dissipation is improved. For example, in a device according to the present disclosure, the cathode may be surrounded and covered on the non-emitting surface by a conductive layer for improved heat dissipation.

According to the present disclosure, in order to avoid the effects of high photocathode resistance, the photocathode can be grown on a highly conductive (but optically transparent) layer, e.g. a thin Cr film. The placement of a heat conducting grid over a large portion (preferably all) of the photocathode area and at a sub-micron distance from the photocathode serves to keep the photocathode from overheating by means of improved heat dissipation. In addition, a relatively thick conducting grid can be provided around the photocathode's active area (~3×3µ²).

In this case, no in-plane current flows in the photocathode, so the only significant potential difference across the highly resistive photocathode material is between the conducting underlayer and the emitting surface. The electrical resistance between these layers is estimated as $$R = R_{sq} \frac{l^2}{S},$$

where $R_{sq}$ is the sheet resistance (in ohms per square), l is the photocathode thickness and S is the area of the photocathode. For $R_{sq}=10^6$-$10^7$ Ω/sq, l=20-40 nm and S=9µ², the resistance R is in the range 50-20000. For a current of 1 mA, this results in a voltage drop of 0.05 V to 2 V across the photocathode. When currents of 10 µA flow in semitransparent photocathodes of conventional phototubes, the corresponding in-plane voltages are at least of the same order of magnitude, since the resistance is of the order of MΩ. (Such currents are allowed according to the tubes' specifications and do not destroy the photocathodes). Such voltages do not lead to manifestation of the electrolytic decomposition. Consequently, the electrolytic decomposition effect would be also avoided in an invented device. The Joule heat dissipated in the photocathode layer would amount to about 0.05 mW to 2 mW.

The inventors have found that a required current density of 10,000 A/cm$^2$ can be obtained in a device with dimensions of 3×3 μm$^2$, meaning a current of ~1 mA. It should be understood that the important parameter is a current density, and not the total current. This depends on applying adequate illumination density. For example, blue laser diodes can be used to support advanced optical disk drives. The reduced wavelength also yields more energetic electrons which assist some critical device performance parameters. Photocathode materials have been identified with yield around 20%, so generating the electron flux is possible with practical photoflux. Calculations show that the reasonably high vacuum level needed to preserve the photocathode, coupled with the small cavity volume of the device, means that positive ion bombardment can be discounted in our case. A thermal model has been created and analyzed showing that using a pulsed operation at a duty ratio of 0.01 to 0.1 is immediately feasible, but generally continuous wave (CW) operation can be used as well. The issue of homogeneity has been considered showing that the construction envisaged would create a very homogeneous structure, so that differential thermal stresses are unlikely to be present. Hence secondary failure causes from this source are unlikely.

The inventors have found that the use of a photocathode layer on a diamond or sapphire substrate (good heat distributor) is preferred. This provides heating at a few degrees Celsius for a 30×30μ$^2$ photocathode area.

Thus, according to one broad aspect of the invention, there is provided an electric device operable with a THz-range frequency of the device output, the device comprising an electrodes' arrangement comprising a photocathode electrode, an anode electrode and at least one gate where the photocathode is exposed to illumination of a predetermined wavelength range thereby creating electrons' emission from the photocathode and a photocurrent through the device; a voltage supply unit for supplying an input electrical signal onto one of the electrodes thereby causing an output electrical signal readable on at least one other electrode; and a signal transmitter/receiver circuit electrically connected to said at least one other electrode to be therefore operable by the output electric signal; the electrodes being spaced from one another a distance not exceeding a few microns, thereby allowing the device operation with a voltage supply of a few tens of volts or less to said at least one electrode and enable to obtain the electrical output in the THz range of frequencies.

The device may or may not include an illumination source as its constructional part. The illumination is operable to illuminate the photocathode with a light beam of certain fixed intensity and the predetermined wavelength range selected in accordance with the photocathode material for extracting electrons therefrom.

The electrodes' arrangement may be configured as a triode structure formed by the photocathode, the anode and the gate electrode located between the photocathode and anode. The gate electrode is preferably spaced from each of the photocathode and anode planes a distance of less than 1 micron, e.g. about 0.1 micron gap between the gate and the photocathode and about 0.3 microns gap between the gate and the anode. The gate may be of a 0.1 micron thickness and a 0.1 micron dimension across a space between the photocathode and the anode.

In some other embodiments of the invention, the electrodes' arrangement is configured as a tetrode structure formed by the photocathode, the anode, the gate and a screen grid electrodes. The latter is located between the gate and anode planes. The electrodes are spaced from one another a gap of less than 1 micron. For example, the gate is spaced from the photocathode a distance of 0.1 micron, and is spaced from the screen grid a 0.3 microns gap, while the screen grid is spaced from the anode a distance of 0.3 microns. The thickness of the gate, as well as that of the screen grid, may be a 0.1 micron.

The photocathode layer may be patterned to form an array of spaced-apart regions of the photocathode material and higher electrically conductive material within the spaces between the photocathode material regions.

According to another broad aspect of the invention, there is provided an electric device operable with a THz-range frequency of the device output, the device comprising a diode structure formed by a photocathode electrode and an anode electrode; and an illumination source configured and operable to generate a light beam in the form a superposition of two light components of slightly different frequencies to thereby illuminate the photocathode by an amplitude modulated wave and cause the corresponding photocurrent to be received at the anode electrode to operate signal transmitter/receiver circuit by an electric signal induced by said photocurrent at the anode.

The illumination source may include two light emitters (preferably laser diodes) generating the two light components of slightly different frequencies, respectively. The wavelengths may be for example 800 nm and 801 nm.

Preferably, the photocathode and anode electrodes are spaced from each other by a gap of a few microns or less.

A signal transmitter/receiver circuit is electrically connected to the anode.

The diode thus operates to convert the THz light input into a THz electrical output which in turn operates the signal transmitter/receiver.

The photocathode and anode layers may be located on facing each other spaced-apart surfaces of first and second substrates, respectively, and the photocathode may be illuminated through an optically transparent substrate. The anode-supporting substrate is formed with an electrical connector from the anode layer to an outer surface of the substrate for coupling to a transmitting/receiving unit. The latter includes an antenna circuit, which may be printed on the substrate's surface.

According to yet another aspect of the invention, there is provided a THz transmitter device comprising a diode structure comprising a photocathode electrode and an anode electrode; and an illumination source configured and operable to generate a light beam in the form a superposition of two light components of slightly different frequencies to thereby illuminate the photocathode by an amplitude modulated wave and cause the corresponding photocurrent to be received at the anode electrode.

According to yet further aspect of the invention, there is provided a THz transmitter device comprising an electrodes' arrangement comprising a photocathode electrode, an anode electrode and at least one gate where the photocathode is exposed to illumination of a predetermined wavelength range thereby creating electrons' emission from the photocathode and a photocurrent through the device; a voltage supply unit for supplying an input electrical signal onto one of the electrodes thereby causing an output electrical signal readable on at least one other electrode; and a signal transmitter/receiver circuit electrically connected to said at least one other electrode to be therefore operable by the output electric signal; the electrodes being spaced from one another a distance not exceeding a few microns, thereby allowing the device operation with a voltage supply of a few tens of volts or less to said at least one electrode and enable to obtain the electrical output in the THz range of frequencies.

BRIEF DESCRIPTION OF THE DRAWINGS

In order to understand the invention and to see how it may be carried out in practice, preferred embodiments will now be described, by way of non-limiting example only, with reference to the accompanying drawings, in which:

FIG. 3 shows a specific example of the configuration of the system of FIG. 1.

DETAILED DESCRIPTION OF EXEMPLARY EMBODIMENTS

Figure 1:
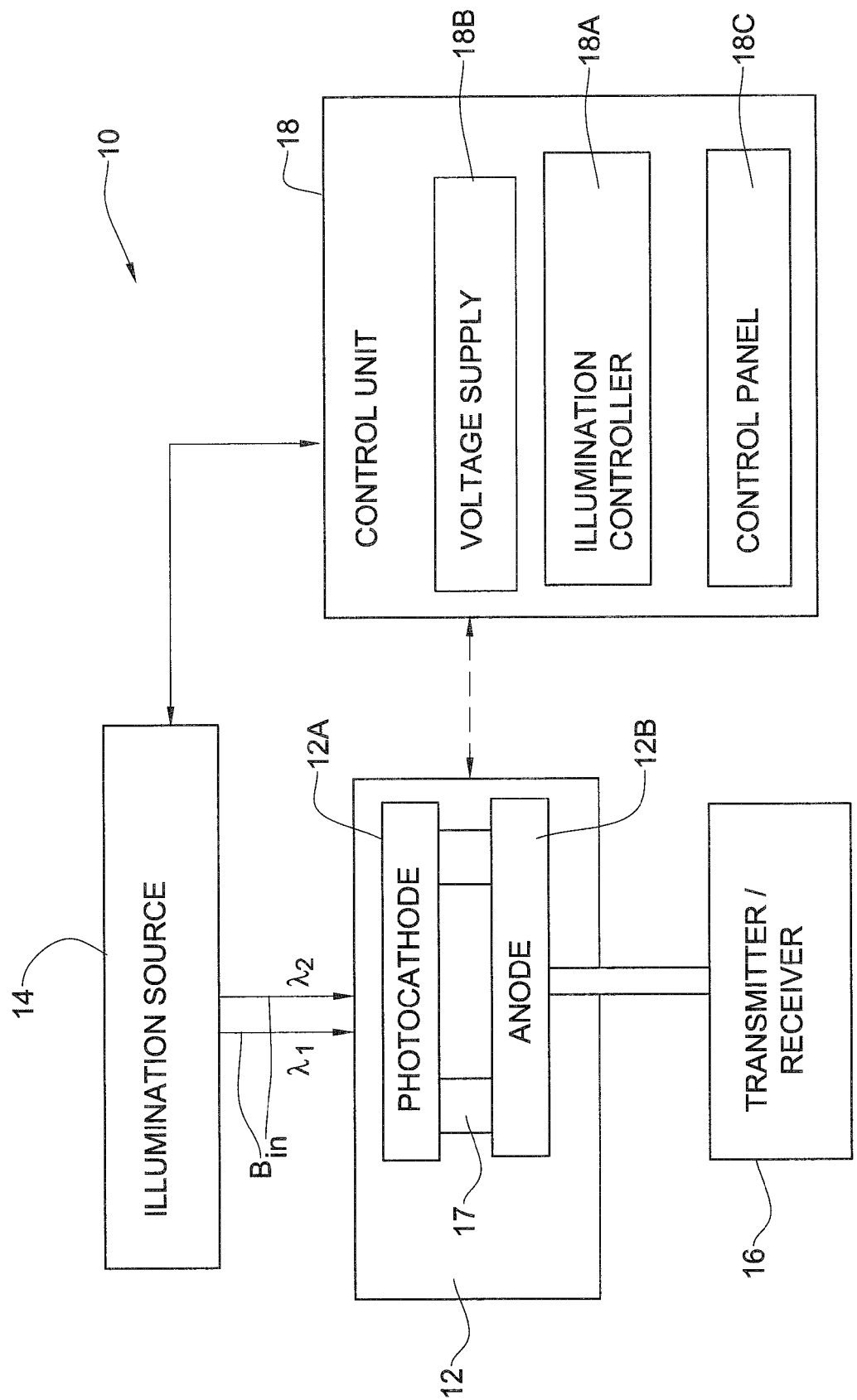
FIG. 1 exemplifies an electronic system according to an example of the present invention.

Referring to FIG. 1, there is exemplified an electronic system, generally at 10, according to the invented technique. The system 10 includes a photoemission based electric device 12 (diode or triode), an illumination source 14, and a transmitter/receiver unit 16. The system is typically associated with a control unit 18, which includes inter alia an illumination controller 18A for controlling the operation of the illumination source 14 and in some embodiments of the invention includes a voltage supply unit 1813 for controlling electrical conditions of the electronic device 12, and may also include an appropriate control panel 18C.

In the present example, the electric device 12 is configured as a diode including a photocathode 12A exposed to illumination from said illumination source 14, and an anode 12B spaced from the photocathode a predetermined distance. The photocathode may be made of any suitable material, selected in accordance with the wavelength of light used, e.g. Bi-alkali, multi-alkali $S_{11}$, $S_{20}$, $S_{25}$, etc.

In the present example, the illumination source 14 is configured and operable for producing an input light beam $B_{in}$ presenting a superposition of two light components $\lambda_1$ and $\lambda_2$ of a small frequency difference, for example one being 800 nm and the other being 801 nm. It should be understood, although not specifically shown, that this can be implemented using two light emitters (e.g. laser diodes) generating said two light components, respectively, and an appropriate arrangement of suitable optical devices (such as mirrors, lenses, optical fibers, etc.) to direct the two beams towards propagation paths intersecting at the photocathode, thereby obtaining a combined light beam in the form of a superposition of these two light components.

Considering the light source (e.g. laser) radiation as a coherent sinusoid, if two nominally equal amplitude waves with a small frequency difference are superimposed, the amplitude of the resulting wave, whose frequency is equal to the sum of the source frequencies, is modulated at a "beat" frequency equal to the difference between the source frequencies. This is the so-called "photomixing" technique. More specifically, the first and second light components have frequencies $\omega_1$ and $\omega_2$ respectively, both being in the optical region of the electromagnetic spectrum, but slightly differing from each other, the frequency difference being in the THz range. The two light components operate on the photocathode in heterodyne fashion so that the electron beam is modulated at the beat frequency. Accordingly, the electric field incident on the photocathode is given by the sum of the electric fields of the respective light components, and the radiation power at the photocathode is proportional to the square of the total electric field. The photocathode, while being incapable to respond by electrons' emission at frequencies $\omega_1$, $\omega_2$, or their sum, can respond at the beat frequency. With $(\omega_1-\omega_2) \ll \omega_1$, $\omega_1 \approx \omega_2$, the photocathode acts as a low frequency filter and averages the incident power over time. If the incident power densities from the two lasers are equal, the incident power is 100% modulated at the beat frequency, and the photoemission will also be modulated at this frequency.

Figure 2A:
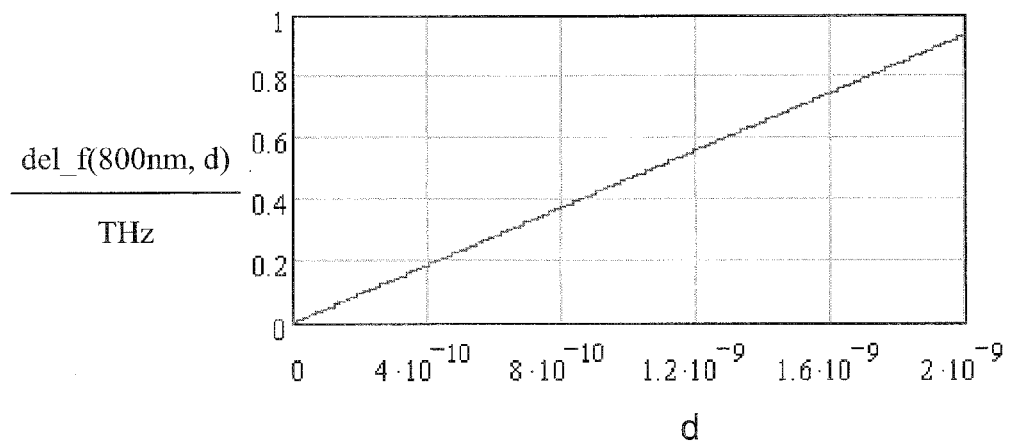
FIG. 2A shows an amplitude modulated wave as a result of photomixing two close frequencies occurring in the system of FIG. 1.

FIG. 2A shows an example of the dependence of the beat frequency in THz range on the difference between the wavelengths of the light components, for the case when one of the wavelengths is 800 nm. For example, the two wavelengths may be $\lambda_1$=800 nm, $\lambda_2$=801 nm, and the difference (beat frequency) is ~0.5 THz.

Figure 2B:
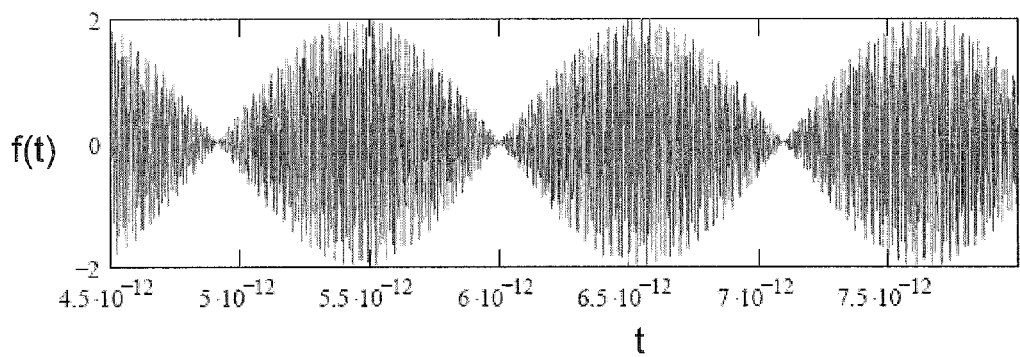
FIG. 2B shows an effect of incorporating a Bragg Grating in a laser diode.

FIG. 2B shows the amplitude modulated wave as a result of photomixing two close frequencies.

The light emitters used in the illumination source are preferably laser diodes, because they can operate with relatively short wavelengths (e.g. about 800 nm) as required for efficient photocathode, and have a reduced line-width. Such a diode laser may incorporate a Bragg grating for the purpose of narrowing and stabilizing the emission wavelength. Commercial laser models exist today, with spectral linewidth of down to $10^{-5}$ nm. This is equivalent to a bandwidth of few MHz.

As indicated above, in some embodiments of the invention the diode is associated with a voltage supply unit which maintains certain potential difference between the photocathode and the anode. It should be understood that alternatively, no predefined potential difference between them is needed: for example the photocathode and anode may be connected to each other via an electrical connector (wire) while the flow of emitted electrons to the anode is initiate due to photoemission of high kinetic energy electrons. In other words, high frequency response can be achieved or supported by using high energy photons in the photoemission process.

Due to the space charge effect, there is a change in the inter-electrode potential resulting in a so-called "virtual cathode", namely a low potential region near the cathode from which effective emission occurs. The effect of higher energy photons can be used to push this virtual photocathode further away from the real photocathode.

Reference is made to FIG. 3 showing a specific but not limiting example of an electronic system generally at 20, according to some embodiments of the invention. The same reference numbers are used for identifying components in the illustrations of FIGS. 1 and 3. The system 20 includes a diode structure 12 formed by spaced-apart photocathode 12A and anode 12B, an illumination source (not shown here) which produces a THz input light modulation which is then converted by the diode device into THz electrical radiation, and a transmitter unit 16 which transmits this radiation. The photocathode 12A and anode 12B are supported by facing each other surfaces of transparent substrates 13A and 13B, respectively, and are spaced from each other a few microns gap 15. The substrates are maintained with a gap between them by means of a supporting spacer 17. As shown in the figure, the transmitter unit 16 includes an electrical connector (conducting via) 19 extending across the anode related substrate 13B thereinside form the anode electrode 12B, and an antenna circuit (bow-tie antenna) 22 located (e.g. printed) on an external surface of the anode substrate 13B, being electrically coupled to the conducting via 19. The photocathode and anode may be kept at, respectively zero and 20V voltages. The system 20 thereby presents a THz antenna arrangement operable at low voltages.

In the above-described examples, a THz transmitting system is achieved using a diode structure formed by photocathode and anode spaced from each other a small distance, and heterodyne fashion illumination of the photocathode. As will be described below, such a THz transmitter can be obtained using a triode or tetrode structure.

In the devices of the invention, the photocathode is adjusted for high-density current ($10^3$ A/cm$^2$), which can be achieved due to the optimal heat distribution as described above, namely using a highly heat distributing substrate (diamond or sapphire) and the use of highly electrically conductive material over which the photocathode is evaporated—such as thin transparent metal (e.g. ~30 Å of Chrome). To achieve even higher electrical conductivity of the photocathode layer, a thicker conductive non transparent grid may be placed beneath the photocathode layer, dividing its area to sub areas, and thus reducing its overall electrical resistivity.

Preferably, the cathode-anode spacing (gap) is very low, e.g. a few microns. This enables reaching high current densities at low voltages, without space charge limiting the current. The light source is also appropriately selected to provide the required density of photon flux. For example for the current density of $10^4$ A/cm$^2$) photocurrent of about 0.1 A, the light density of $10^5$ W/cm$^2$ is needed.

The temporal response of a photocathode, while being generally limited by electron diffusion, can practically be 50-200 femto-seconds, which supports photo-current at frequencies of up to at least 3 THz. The lower obtainable frequency is limited by the laser diode line-width, or more precisely by the convolution of the two laser diodes' line-widths. For substantially identical laser diodes whose spectral lines are modeled by Gaussians, a spectral width at THz proportional to the single laser diode line-width can be obtained.

The efficiency of THz CW production is much higher when using a photocathode, than that using a low-temperature-grown-GaAs photodiode. In the latter technique, only a few microwatts are transmitted, while in the photocathode based diode exposed to similar light sources (diode lasers) about 1 mW of THz radiation can be transmitted.

Figures 4A, 4B:
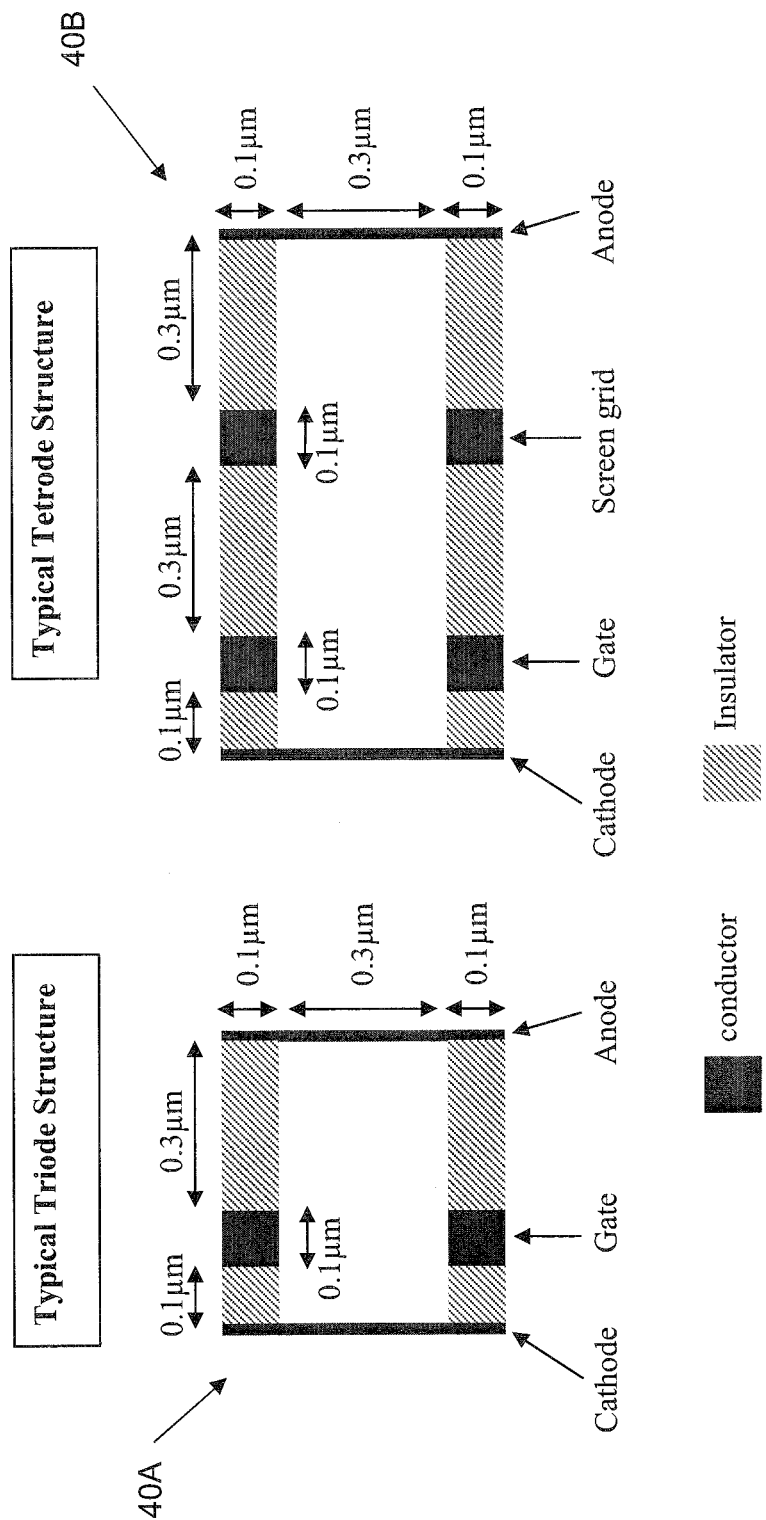
FIGS. 4A and 4B exemplify triode and tetrode structure configured for the purposes of the invention.

Reference is made to FIGS. 4A and 4B illustrating examples of triode and tetrode structures 40A and 40B suitable to be used as a photoemission based electric device in a THz transmitter/receiver system of the present invention. It should be understood, although not specifically shown here, that such a system includes an illumination source for generating a light beam of an appropriate wavelength range and power profile for emitting electrons from the photocathode arranged to be exposed to this illumination, and a control unit including an illumination control utility and a voltage supply control utility. The photocathode is exposed to certain fixed illumination, an input electrical signal at THz region is supplied to one of the electrodes (e.g. the gate), and the device operation (photocurrent) amplifies the input signal, and the amplified output is read at another electrode (e.g. the anode). The examples described below show how the electrodes' arrangement (dimensions and distances between the electrodes) of the triode/tetrode electric device allows for reaching THz range frequencies. These devices are configured with special construction of the photocathode and very small dimensions of electrodes' and spaces between them and is operable with suitably small voltages to enable high current density and high frequency (up to THz range) electrical output.

As shown, in the triode 40A, the photocathode is spaced from the 0.1 μm thick gate a distance of 0.1 μm, and the gate further is spaced from the anode a distance of 0.3 μm. In the tetrode 40B, a screen grid is placed between the gate and anode planes being spaced from each of them the 0.3 μm distance. The dimension of the gate and screen grids' elements across the gap between the electrodes is 0.1 μm, leaving a lateral space of 0.3 μm for the electrons propagation.

The inventors have shown that the construction of a THz transmitter/receiver system utilizing a photocathode is feasible, and can provide a required current density. The use of a small gap between the electrodes of the electric device used in this system implies a desirable space-charge limit at ~10,000 A/cm$^2$. The entire device may be of sub-micron dimensions, such that the transit time of electrons through the device is much shorter than the highest frequency of the processed signal.

The invention claimed is:

1. An electric device configured and operable at least as a transmitter of signals in a THz-range frequency, the device comprising:

an electrodes' arrangement comprising at least a photocathode electrode layer and an associated anode electrode layer arranged in planes with a small gap between them, the photocathode layer being located on a heat distributing substrate made of diamond or sapphire, one electrode of the electrodes' arrangement serving for supplying an input signal, and another electrode of the electrodes' arrangement serving for reading therefrom an output electrical signal corresponding to a photocurrent through the device created by electrons' emission from the photocathode electrode in response to illumination of a predetermined wavelength range; and an antenna circuit electrically connected to said electrode at which the output electrical signal is read and being operable by an electric signal induced by said photocurrent for receiving and transmitting radiation with THz-range frequency.

2. The device of claim 1, wherein the gap between the photocathode and anode planes is of a few microns.

3. The device of claim 1, wherein electrodes of the electrodes' arrangement are spaced from one another at a distance of micron to sub-micron dimensions.

4. The device of claim 1, wherein said anode electrode layer is located on a surface of a substrate facing the photocathode such as to define said gap between the photocathode and anode planes.

5. The device of claim 4, wherein the substrates carrying the photocathode and the anode are substantially transparent to said illumination.

6. The device of claim 4, wherein a supporting spacer is provided between the substrates carrying the photocathode and the anode to maintain a spaced-apart relationship of the substrates defining said gap between the photocathode and anode planes.

7. The device of claim 4, further comprising an electrical connector extending across the substrate carrying the anode electrode, said electrical connector connecting the anode electrode to the antenna circuit located on an external surface of the anode substrate.

8. The device of claim 1, wherein the antenna circuit is configured as a bow-tie antenna.

9. The device of claim 1, wherein the electrodes' arrangement comprises a gate electrode located in a plane between the photocathode and anode planes.

10. The device of claim 9, wherein the gate electrode is located in a plane spaced from each of the photocathode and anode planes by a gap of less than 1 micron.

11. The device of claim 10, wherein the gate is spaced submicron distances from the photocathode and anode respectively.

12. The device of claim 11, wherein the gate is spaced from the photocathode and anode at distances of about 0.1 micron and 0.3 microns, respectively.

13. The device of claim 9, wherein said gate electrode has a thickness of about 0.1 micron and a dimension across the gap between the photocathode and the anode of about 0.1 micron.

14. The device of claim 9, wherein the electrodes' arrangement further comprises a screen grid electrode located between the gate and the anode planes.

15. The device of claim 14, wherein the electrodes are spaced from one another by a gap of less than 1 micron.

16. The device of claim 15, wherein the gap between the gate electrode and the photocathode is 0.1 micron, the gap between the gate and screen grid is 0.3 microns, and the gap between the screen grid and the anode is 0.3 microns.

17. The device of claim 14, wherein a thickness of the gate and of the screen grid is of about 0.1 micron.

18. The device of claim 1, wherein the photocathode layer is patterned to form an array of spaced-apart regions of a photocathode material and higher electrically conductive material within the spaces between the photocathode material regions.

19. The device of claim 1, further comprising an illumination source operable to illuminate the photocathode with light of a certain fixed intensity and said predetermined wavelength range selected in accordance with a photocathode material for extracting electrons therefrom.

20. The device of claim 1, comprising an illumination source configured and operable to generate a light beam in the form a superposition of two light components of slightly different frequencies to thereby illuminate the photocathode by an amplitude modulated wave and cause the corresponding photocurrent to be received at the anode electrode, the antenna circuit being electrically connected to the anode electrode.

21. The device of claim 20, wherein a density of the photocurrent is of about 1 mA/cm$^2$ and higher.

22. The device of claim 3, wherein a space-charge limit is of about 10,000 A/cm$^2$.

23. The device of claim 3, wherein an operating voltage is of the order of a few volts.

24. An electric device configured and operable at least as a transmitter of signals in a THz-range frequency, the device comprising:
  an electrodes' arrangement comprising at least a photocathode electrode layer and an associated anode electrode layer arranged in planes with a small gap between them, wherein:
  the photocathode layer is located on a substrate which is optically transparent for a predetermined wavelength range and is heat distributing;
  one electrode of the electrodes' arrangement serves for supplying an input signal, and another electrode of the electrodes' arrangement serves for reading therefrom an output electrical signal corresponding to a photocurrent through the device created by electrons' emission from the photocathode electrode in response to illumination of said predetermined wavelength range; and
  an antenna circuit electrically connected to said electrode at which the output electrical signal is read and being operable by an electric signal induced by said photocurrent for receiving and transmitting radiation with THz-range frequency.

* * * * *